(12) United States Patent
Brown

(10) Patent No.: US 6,434,657 B1
(45) Date of Patent: Aug. 13, 2002

(54) METHOD AND APPARATUS FOR ACCOMMODATING IRREGULAR MEMORY WRITE WORD WIDTHS

(75) Inventor: Jeff S. Brown, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 113 days.

(21) Appl. No.: 09/666,676

(22) Filed: Sep. 20, 2000

(51) Int. Cl.[7] ............................................... G06F 12/00
(52) U.S. Cl. ............................ 711/1; 711/217; 711/173
(58) Field of Search ................................. 711/157, 153, 711/173, 217, 218, 219, 1

(56) References Cited

U.S. PATENT DOCUMENTS 6,081,210 A * 6/2000 Nikolic et al. ................. 341/59
6,243,496 B1 * 6/2001 Wilkinson ................... 382/245

\* cited by examiner

Primary Examiner—Hiep T. Nguyen
(74) Attorney, Agent, or Firm—Suiter & Associates PC

(57) ABSTRACT

A method and apparatus for accommodating irregular memory write word widths allow for writing to multiple rows in a memory so as to reduce or eliminate holes in the address read space. First and second memory blocks are provided that include a first bitcell selectable by a first write bitline and a second bitcell selectable by a second write bitline. Where a write word width is not equal to a read word width and is not some factor of a power of two times the read word width, the column decode to read out the entire word is not a power of two, and holes in the read address space will exist. When the write address is even, a first range of bits is written to the first block on a first write bitline, a second range of bits is written to the second block on the first write bitline, and a third range of bits is written to the first block on a second write bitline. When the write address is odd, a first range of bits is written to the second block on the first write bitline, a second range of bits is written to the first block on the first write bitline, and a third range of bits is written to the second block on the second write bitline. Reading of data from the memory occurs as with a typical memory structure.

18 Claims, 5 Drawing Sheets

METHOD AND APPARATUS FOR ACCOMMODATING IRREGULAR MEMORY WRITE WORD WIDTHS

BACKGROUND

The present invention relates generally to memory devices, and particularly to memory writing schemes.

In electronic memory systems, it is often desirable to allow writing to multiple rows in a memory device. However, when write word widths are not a power of two times the read word width, address holes in the read address space will result. In previous solutions to this problem, the memory array was made larger so as to end up with a power of two for the column decode in order to eliminate holes in the read address space. This solution is disadvantageous since it requires the memory area to be larger for a given storage capacity and can require overhead external to the memory area in order to account for address holes.

SUMMARY

The present invention allows writing to multiple rows in a memory device that eliminates holes in the address space arising from writing in word widths that are not a power of two times the read word width. In one embodiment, the present invention includes first and second memory blocks, a circuit for determining whether an address of a write word to be written to either of the first and second memory blocks is even or odd, and a second circuit for writing a first group of bits in the write word to the first memory block and a second group of bits in the write word to the second memory block when the address of the word is even, and for writing a first group of bits in the write word to the second memory block and second group of bits in the write word to the first memory block when the address of the write word is odd, wherein address holes in read address space of said first and second information storing means are reduced or eliminated.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to an/one or more embodiment(s) of the invention, an example of which is illustrated in the accompanying drawings.

Figure 1:
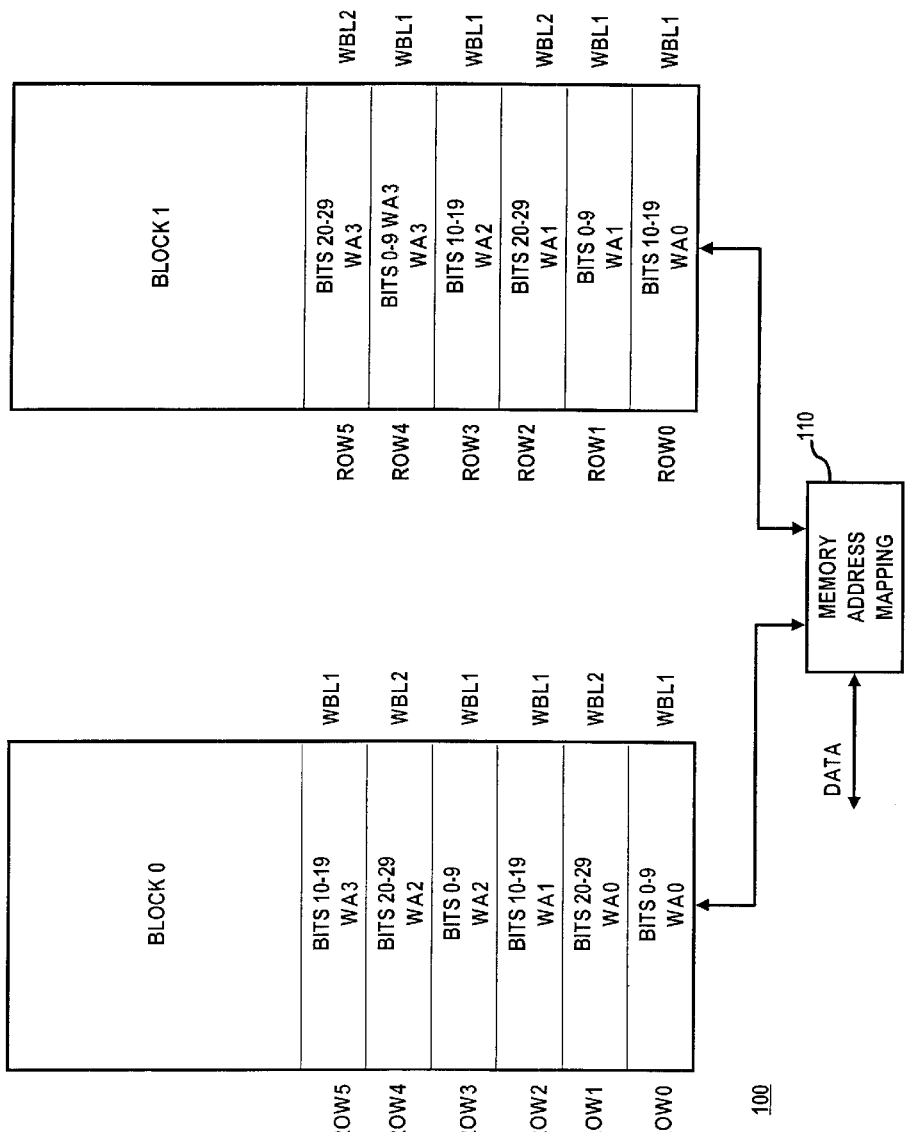
FIG. 1 is a block diagram of a memory array structure showing two memory blocks and a memory writing scheme in accordance with the present invention.

Referring now to FIG. 1, a diagram of a memory array structure including two memory blocks will be discussed.

Figure 2:
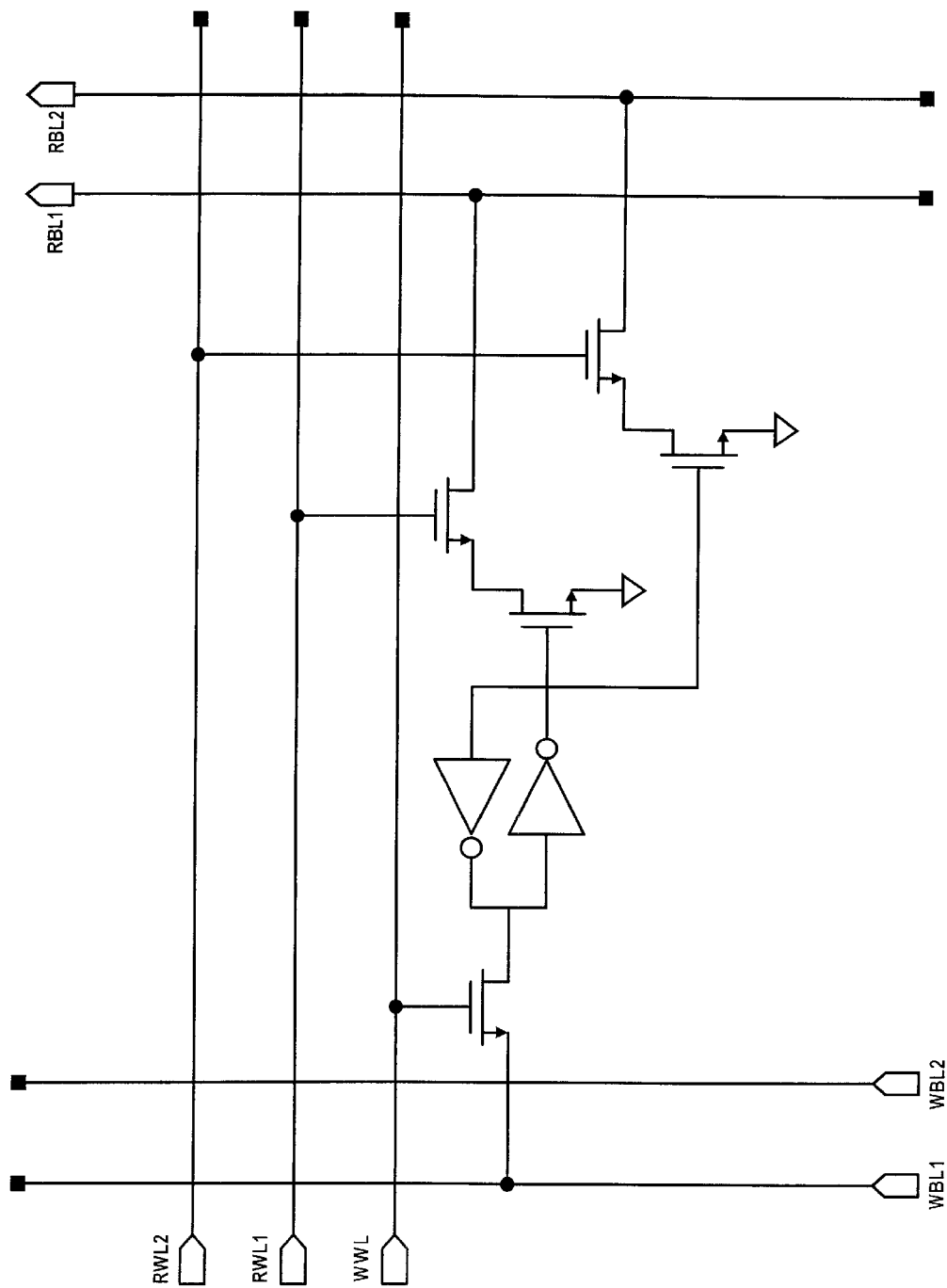
FIG. 2 is a schematic diagram of a first bitcell circuit connected to a first write port in accordance with the present invention.
Figure 3:
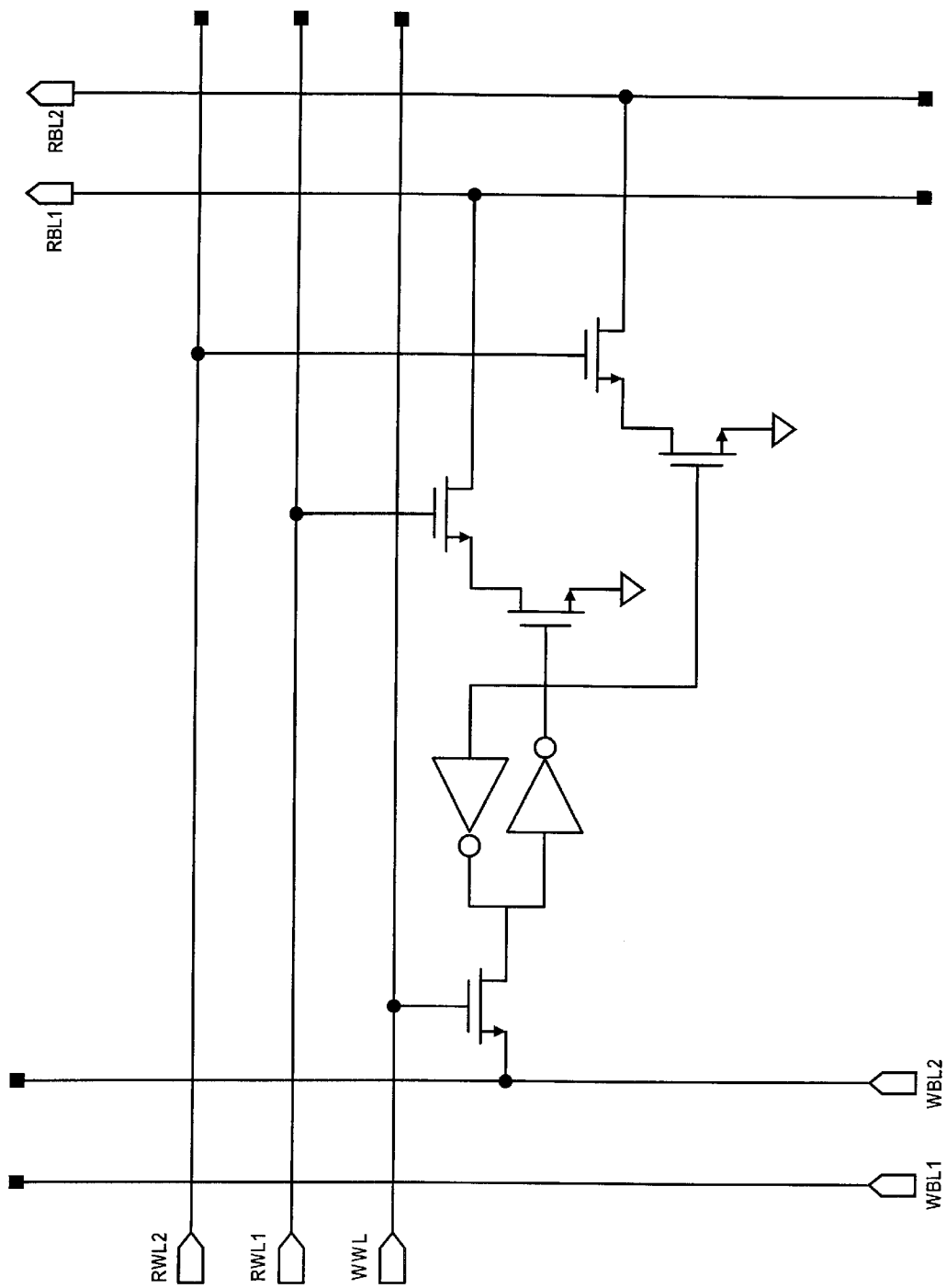
FIG. 3 is a schematic diagram of a second bitcell circuit connected to a second write port in accordance with the present invention.

The memory array structure 100 shown in FIG. 1 is for purposes of example. Although one particular memory array structure is shown in FIG. 1, other memory array structures may be utilized without departing from the scope of the present invention and without providing substantial change thereto. In memory array structure 100, memory is divided into two blocks, Block 0 and Block 1. Each write word width is 30 bits, each read word width is five bits, and a read column decode of four is utilized. The number of physical columns (NPC) in each row of each of Block 0 and Block 1 is ten. Forty words can be written to each block for a total of 1200 bits stored in each block (40 words times 30 bits per write word equals 1200 bits per block) resulting in 240 read words (1200 bits divided by five bits per read word equals 240 read word). The number of physical rows (NPR) in each block is 60 (240 read words divided by a column decode of four equals 60 rows). In a first write operation, a first write word for the first write address (WA0) is written into Row 0 of Block 0 for bits 0–9, then into Row 0 of Block 1 for bits 10–19, and then into Row 1 of Block 0 for bits 20–29 of the write word as shown in FIG. 1 as write address WA0. The writing in Row 0 of Blocks 0 and 1 is done using a first version of a bit cell 200 as shown in FIG. 2 where the data is written into bitcell 200 from write bitline 1 (WBL1). The writing in Row 1 of Block 0 is done with a second version of a bitcell 300 shown in FIG. 3 where the data is written into bitcell 300 from write bitline 2 (WBL2). Write wordline decoding is such that only one write wordline (WWL) in Row 1 will assert. For write address 0 (WA0), this is the write wordline for Row 1 in only Block 0.

In a second write operation, a second write word for the second write address (WA1) written into Row 1 of Block 1 for bits 0–9, and then into Row 2 of Block 0 and Block 1 for bits 10–19 and bits 20–29, respectively, as shown by write address 1 (WA1) in FIG. 1. The writing operation in Row 1, Block 1, and Row 2, Block 0, is done to first bitcell 200 through write bitline 1 (WBL1). The writing in Row 2, Block 1, is done with the second bitcell 300 through write bitline 2 (WBL2).

The actual memory data inputs for write bits 0–19 are routed and gated to drive up either Block 0 or Block 1 on the WBL1 write bitlines depending on if the word to be written is an even word or an odd word. Write bits 20–29 will be driven up on the WBL2 write bitlines for both blocks. The wordline decoding based on even or odd write determines which of Block 0 or Block 1 gets bits 20–29 written thereto. The even word, odd word writing scheme is summarized in Table 1.

TABLE 1

Even word, odd word writing scheme.

| BITS | EVEN WORDS | ODD WORDS |
| --- | --- | --- |
| 0–9 | Block 0 | Block 1 |
|  | WBL1x | WBL1x |
| 10–19 | Block 1 | Block 0 |
|  | WBL1x | WBL1x |
| 20–29 | Block 0 | Block 1 |
|  | WBL2x | WBL2x |

The approach described provides greater storage density, which is a function of the bitcell size resulting from an additional write bitline. In memories having a higher number of ports, the impact is reduced. In an alternative embodiment of the present invention, an external optional memory address mapping circuit 110 outside of the memory area is provided. Readout of memory array structure 100 is performed as with a typical memory structure.

Figure 4:
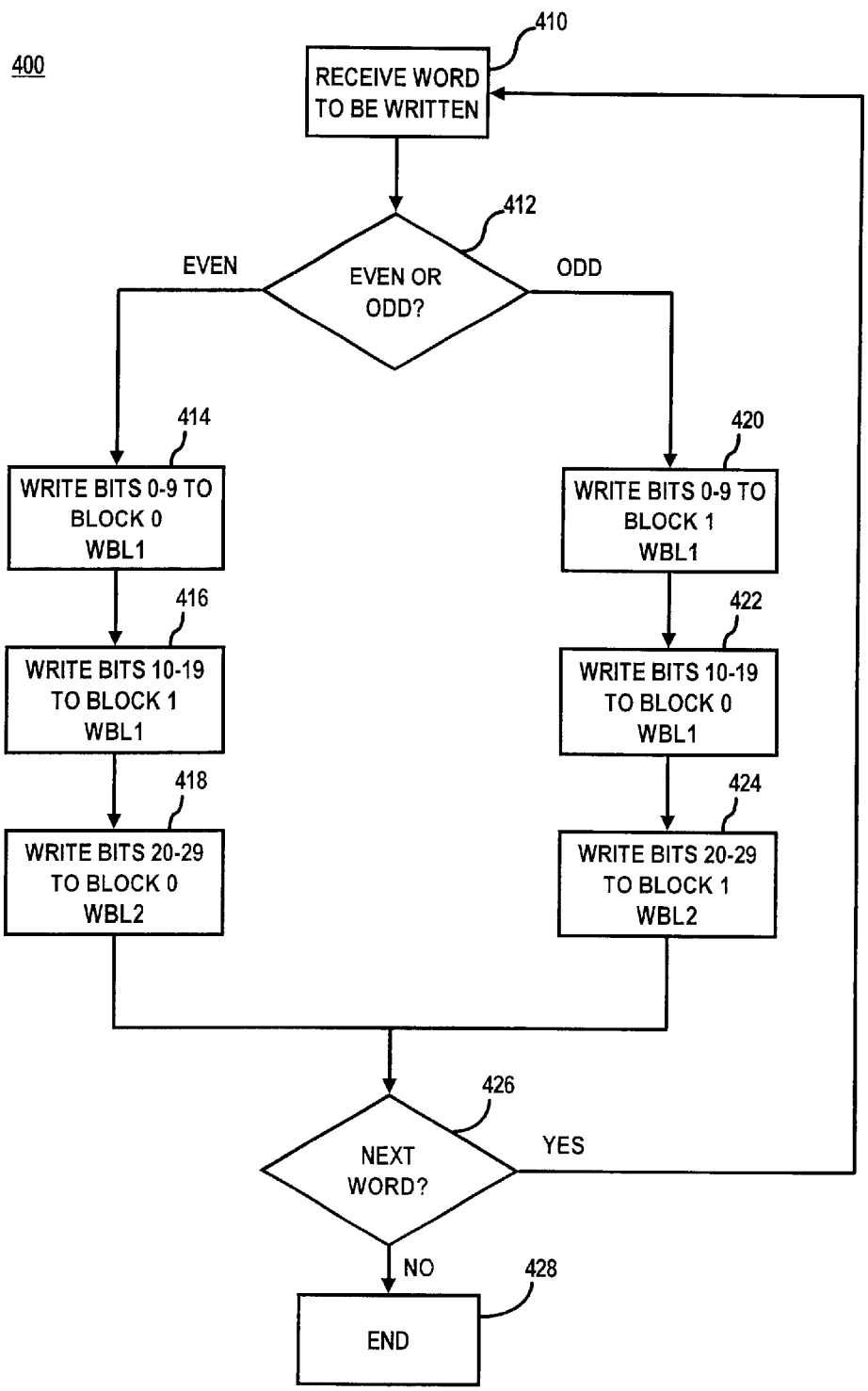
FIG. 4 is a flow diagram of a method for writing to memory in accordance with the present invention.

Referring now to FIG. 4, a flow diagram of a method for writing to multiple rows in a memory in accordance with the present invention will be discussed. Method 400 may be implemented for example with a logic circuit that controls the routing of memory write operations to the proper row and block of memory array structure 100. In an alternative embodiment, method 400 may be implemented with an external memory address mapping circuit 110. Method 400 initiates with the receiving of a word to be written at step 410. A determination is made at step 412 whether the address of the word is even or odd. In the event the write word address is even (e.g., WA0, WA2, WA4, . . . , WAn, where n is an even number), steps 414, 416, and 418 are executed. Bits 0–9 are written to Block 0 using write bitline 1 (WBL1), bits 10–19 are written to Block 1 using write bitline 1 (WBL1), and bits 20–29 are written to Block 0 using write bitline 2 (WBL2). In the event the write word address is odd (e.g., WA1, WA3, WA5, WAm, where m is an odd number), steps 420, 422, and 424 are executed. Bits 0–9 are written to Block 1 using write bitline 1 (WBL1), bits 10–19 are written to Block 0 using write bitline 1 (WBL1), and bits 20–29 are written to Block 1 using write bitline 2 (WBL2). A determination is made a step 426 whether another word is to be written to memory array structure 100. In the event another word is to be written, method 400 continues to execute with the next word at step 410. In the event no additional words are written, method 400 terminates at step 428. Although one order of the steps of method 400 is shown for example, method 400 may be modified to change the order and the number of steps utilized, including fewer or greater steps, without departing from the scope of the invention and without providing substantial change thereto.

Figure 5:
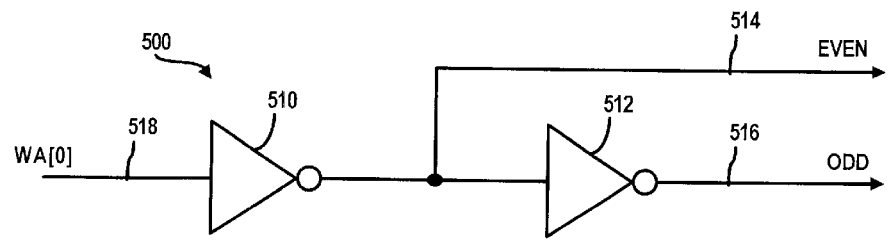
FIG. 5 is a schematic diagram of a circuit for determining whether a word to be written is even or odd.

Referring now to FIG. 5, a schematic diagram of a circuit for determining whether a word to be written is even or odd will be discussed. Even-odd circuit 500 comprises first and second cascaded inverters 510 and 512 as shown. The input 518 of inverter 510 receives the least significant write address as an input. The output of inverter 510 is provided as an even signal 514 that is active high. Even signal 524 is also provided as an input to inverter 512 to provide an odd output signal 516 that is also active high. The even signal 514 and odd signal of even-odd circuit 500 are provided to memory address mapping circuit 110 as shown in FIG. 6.

Figure 6:
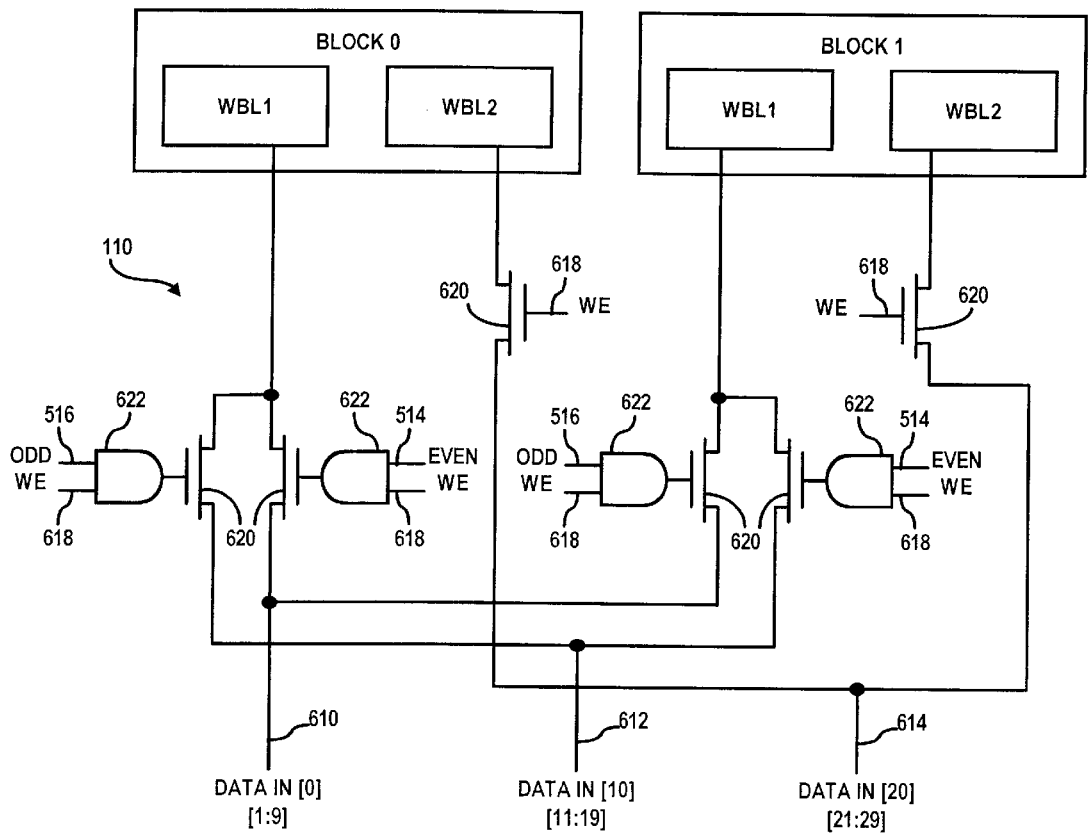
FIG. 6 is a schematic diagram of a circuit for implementing memory address mapping in accordance with the present invention.

Referring now to FIG. 6, a schematic diagram of a memory address mapping circuit in accordance with the present invention will be discussed. Memory address mapping circuit 110 receives data input at lines 610, 614, and 616 as shown. A write enable signal 616 is applied to respective switches 620 and logic gates 622, which are AND gates in the embodiment shown. Even signal 514 and odd signal 516 are applied to logic gates 622 as shown. Based upon the determined even or odd characteristic of the input write word, memory address mapping circuit 100 will write the data to either WBL1 or WLB2 of either of Block 0 and Block 1 in accordance with the present invention as discussed herein. Although one particular embodiment of memory address mapping address circuit 110 is shown in FIG. 6, it should be noted that the circuit may be modified, altered, or implemented in a different form without departing from the scope of the invention and without providing substantial change thereto. For example, logic gates 622 may be implemented using OR gates rather than AND gates in an appropriate configuration, such as using inverters to arrive at the proper logic function, without changing the function of memory address mapping circuit 110.

It is believed that the method and apparatus for accommodating irregular memory write word widths of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. An apparatus, comprising:

first and second means for storing information;

means for determining whether an address of a write word to be written to either of said first and second information storing means is even or odd;

means for writing a first group of bits in the write word to said first information storing means and a second group of bits in the write word to said second information storing means when the address of the word is even; and means for writing a first group of bits in the write word to said second information storing means and second group of bits in the write word to said first information storing means when the address of the write word is odd;

wherein address holes in read address space of said first and second information storing means are reduced.

2. An apparatus as claimed in claim 1, wherein address holes in read address space of said first and second information storing means are eliminated.

3. An apparatus as claimed in claim 1, further comprising means for mapping an address of the write word to said first and second information storing means.

4. An apparatus as claimed in claim 1, said first and second storing means comprising a first means for storing a bit of information selectable by a first write bitline, and a second means for storing a bit of information selectable by a second write bitline.

5. An apparatus as claimed in claim 4, said second write bit line being asserted for a predetermined range of bits of the write word, and said first write bit line being otherwise asserted.

6. An apparatus as claimed in claim 1, wherein column decode address bits are a predetermined range of least significant address bits.

7. An apparatus, comprising:

first and second memory blocks;

a first circuit for determining whether an address of a write word to be written to either of said first and second information storing means is even or odd; and a second circuit for writing a first group of bits in the write word to said first memory block and a second group of bits in the write word to said second memory block when the address of the word is even, and for writing a first group of bits in the write word to said second memory block and second group of bits in the write word to said first memory block when the address of the write word is odd;

wherein address holes in read address space of said first and second information storing means are reduced.

8. An apparatus as claimed in claim 7, wherein address holes in read address space of said first and second storage blocks are eliminated.

9. An apparatus as claimed in claim 7, further comprising a memory address mapping circuit coupled to said first and second memory blocks.

10. An apparatus as claimed in claim 7, said first memory and second memory blocks comprising a first bitcell selectable by a first write bitline, and a second bitcell selectable by a second write bitline.

11. An apparatus as claimed in claim 10, said second write bit line being asserted for a predetermined range of bits of the write word, and said first write bit line being otherwise asserted.

12. An apparatus as claimed in claim 7, wherein column decode address bits are a predetermined range of least significant address bits.

13. A method, comprising:
   receiving a write word to be written to either of first and second memory blocks;
   determining whether an address of the write word is even or odd;
   writing a first group of bits in the write word to the first memory block and a second group of bits in the write word to the second memory block when the address of the word is even; and
   writing a first group of bits in the write word to the second memory block and a second group of bits in the write word to the first memory block when the address of the write word is odd;
   wherein address holes in read address space of the first and second memory blocks are reduced.

14. A method as claimed in claim 13, wherein address holes in read address space of the first and second memory blocks are eliminated.

15. A method as claimed in claim 13, further comprising the step of mapping an address of the write word to the first and second memory blocks.

16. An apparatus as claimed in claim 13, said first and second memory blocks comprising a bitcell selectable by a first write bitline, and a second bitcell selectable by a second write bitline.

17. An apparatus as claimed in claim 16, said second write bit line being asserted for a predetermined range of bits of the write word, and said first write bit line being otherwise asserted.

18. An apparatus as claimed in claim 1, wherein column decode address bits are a predetermined range of least significant address bits.

* * * * *